United States Patent
Sotgiu et al.

(10) Patent No.: US 6,680,793 B2
(45) Date of Patent: Jan. 20, 2004

(54) TEMPERATURE-STABILIZED OPTICAL AMPLIFIER AND METHOD FOR TEMPERATURE-STABILIZING AN OPTICAL AMPLIFIER

(75) Inventors: Riccardo Sotgiu, Solbiate Olona (IT); Paolo Vavassori, Bergamo (IT)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/992,146

(22) Filed: Nov. 14, 2001

(65) Prior Publication Data

US 2002/0122244 A1 Sep. 5, 2002

Related U.S. Application Data

(60) Provisional application No. 60/252,099, filed on Nov. 21, 2000.

(51) Int. Cl.[7] .................................................. H01S 3/00
(52) U.S. Cl. ..................................... 359/337; 359/341.3
(58) Field of Search ......................... 359/341.3, 341.33, 359/337

(56) References Cited

U.S. PATENT DOCUMENTS

| | | | |
|---|---|---|---|
| 4,571,728 A | 2/1986 | Yoshikawa | 372/36 |
| 5,287,216 A | 2/1994 | Chirravuri et al. | 359/341 |
| 5,485,481 A | 1/1996 | Ventrudo et al. | 372/6 |
| 5,936,763 A | 8/1999 | Mitsuda et al. | 359/341 |
| 6,320,695 B1 * | 11/2001 | Tanaka et al. | 359/341.33 |
| 6,456,637 B1 * | 9/2002 | Holcomb et al. | 372/40 |

FOREIGN PATENT DOCUMENTS

| | | | |
|---|---|---|---|
| EP | 0 722 232 A1 | 7/1996 | H04B/10/17 |
| WO | WO 99/43117 | 8/1999 | H04J/14/00 |

* cited by examiner

*Primary Examiner*—Mark Hellner
(74) *Attorney, Agent, or Firm*—Kenta Suzue; Wilson Sonsini Goodrich & Rosati

(57) ABSTRACT

A temperature-stabilized optical amplifier (100) comprises at least an erbium-doped waveguide (101) for amplifying optical signals; at least a first and a second pump sources (103, 104) for generating respective pump beams at a first and, respectively, a second pump wavelength ($\lambda_1$, $\lambda_2$), said first and second pump wavelength being lower and, respectively, higher than 978 nm at an intermediate temperature of a predetermined range of temperature, and being subjected to drift as a consequence of temperature variations; and a pump distribution device (105), optically coupled to said pump sources for receiving said pump beams, and optically coupled to said at least an erbium-doped waveguide for feeding to said at least an erbium-doped waveguide a mixed pump radiation comprising at least a power fraction of each of said pump beams.

18 Claims, 10 Drawing Sheets

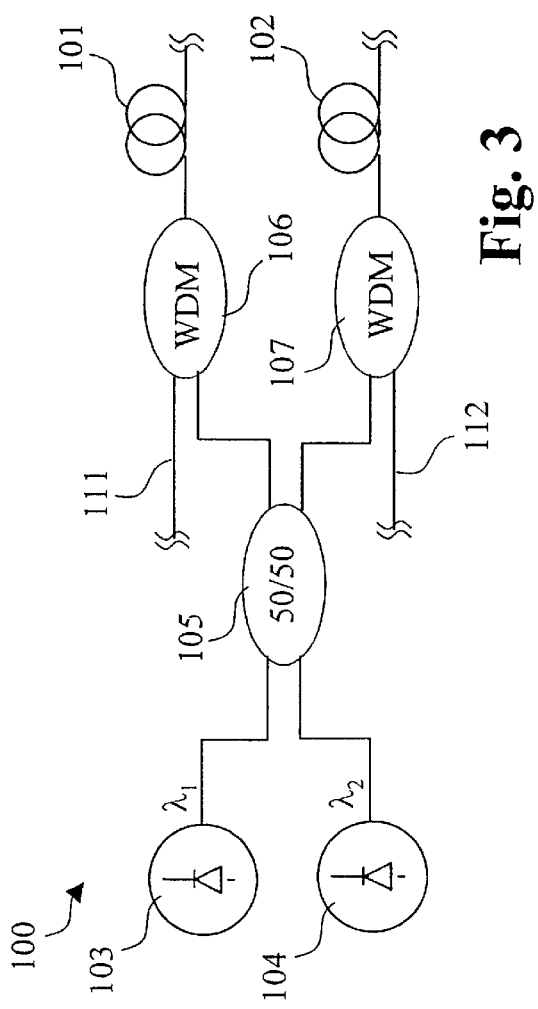
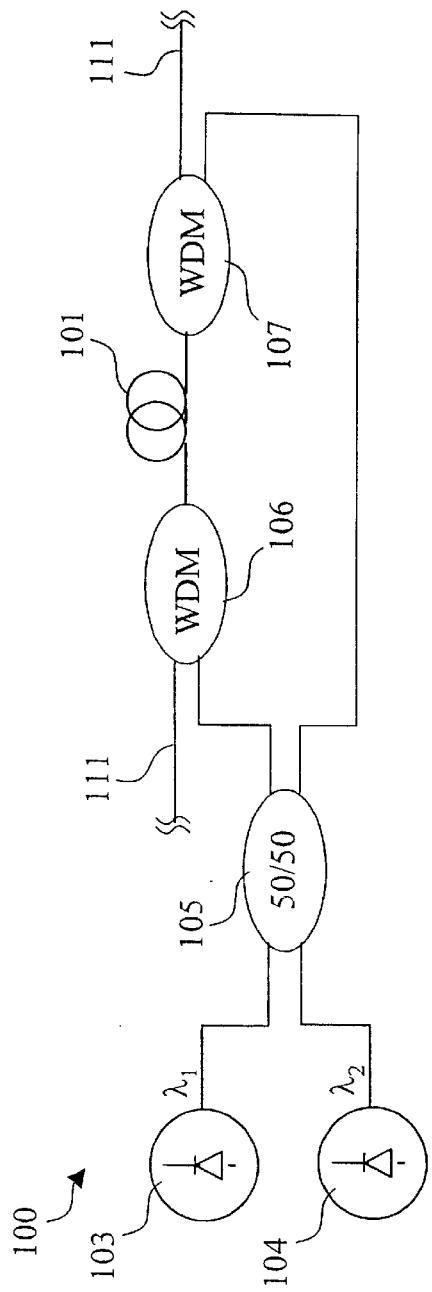
Fig. 3
Fig. 4

TEMPERATURE-STABILIZED OPTICAL AMPLIFIER AND METHOD FOR TEMPERATURE-STABILIZING AN OPTICAL AMPLIFIER

This application claims the benefit of priority under 35 USC §119 (e) of U.S. Provisional Application Serial No. 60/252,099 filed on Nov. 21, 2000.

This application claims the benefit of priority under 35 USC §119 of European Patent Application Serial No. EP00124835.0, filed on Nov. 14, 2000.

BACKGROUND OF INVENTION

The present invention relates to a temperature-stabilized optical amplifier for optical telecommunications and to a method for temperature-stabilizing an optical amplifier. In particular, the present invention relates to a temperature-stabilized fiber-optic amplifier suitable for metropolitan optical networks, i.e. optical networks typically adapted to transmit signals at distances of some kilometers or some tenths of kilometers (up to about 300 km).

As known, fiber-optic telecommunication systems are usually equipped with fiber-optic amplifier for the amplification of optical signals. A fiber-optic amplifier typically comprises an active optical fiber that is opportunely doped with ions of a rare-earth element such that signal light with wavelength of approximately 1530–1565 nm can be amplifier in the fiber if the population of the excited states of the erbium ions is such that rate of stimulated emission exceeds that of spontaneous emissions and absorption. In such a circumstance, light within the gain bandwidth entering the optical fiber will experience net gain, and will exit the fiber with greater power.

An optical pump source, coupled to the wave-guiding portion of the optical fiber, provides a pump radiation to the active fiber in order to excite the dopant ions onto an excited state. In the case of erbium doping, a high-power diode laser with emission to approximately 980 nm is typically used. Pumping at this wavelength results in low noise figure amplifiers. The relatively small cross-sectional area of the wave-guiding portion of the optical fiber helps to ensure high intensity pumping and therefore allow appreciable gain of the signal wavelengths. However, the properties of the signal produced by such an amplifier will depend to a large extent on the properties of the diode laser used to pump the fiber.

practical system, the diode lasers are permanently and robustly connected by an opto-mechanical apparatus to a length of undoped optical fiber, which in turn is connected to the doped fiber in the optical amplifier. The assembly consisting of the diode laser, the opto-mechanical apparatus and the undoped optical fiber is called a pigtailed diode laser. Presently, many pigtailed diode lasers have undesirable characteristics such as wavelength and intensity instabilities that create noise in the pumped system. One of the most troublesome sources of diode laser noise in 980 nm diode lasers is wavelength fluctuation caused by changes in temperature. This dependency is substantially linear, and a typical value of the ratio between the emission wavelength variation and temperature is about 0.33 nm/° C. These wavelength emission variations make erbium amplifiers unstable within the usual working temperature range, i.e. approximately between 0 and 65° C.

It is known that the gain G of an erbium-doped amplifier is a function of the absorbed pump power, which depends on the pump absorption coefficient $\alpha(\lambda)$ of the active fiber at the pump wavelength $\lambda$. In turn, the pump absorption coefficient $\alpha(\lambda)$ can be expressed as:

$$\alpha(\lambda) = 10 \cdot \log e^{\sigma(\lambda) N_t \Gamma L}$$

where $\sigma(\lambda)$ is the absorption cross-section, $N_t$ is the erbium ion concentration, $\Gamma$ is the confinement factor (fraction of the optical power contained in the core), and L is the length of the active fiber.

As the pump wavelength $\lambda$ varies, the pump absorption coefficient $\alpha(\lambda)$ and, therefore, the absorbed pump power, vary in accordance with the new value of the pump absorption coefficient at that new wavelength. FIG. 1 shows the typical curve of pump absorption coefficient vs. emission wavelength and the shift of the working points A and B of two different laser diodes into new working points A' and B' as the temperature increases. When the temperature varies, the absorbed power fraction of the active fibers varies in accordance to the position of the working point of the laser diode on the depicted curve. FIG. 2 illustrates the linear dependency (with a slope of approximately 0.33 nm/° C.) of the emission wavelength on temperature for a typical laser diode.

The Applicant has verified that an optical amplifier comprising an active fiber having a peak absorption of 5 dB and pumped by a single laser pump that is not stabilized can experience a pump absorption variation of more than 3.5 dB when the temperature varies in the temperature range 0–65° C. Applicant has also noticed that laser diodes of a same type, even when obtained from the same manufacturing process, usually have slightly different emission wavelengths due to manufacturing tolerance.

In order to improve the temperature-insensitivity of the amplifier, the working temperature of the laser diode can be stabilized by using a Peltier cell, as suggested for example in U.S. Pat. No. 4,571,728, and the emission wavelength of the laser diode can be stabilized by using a fiber Bragg grating, as suggested for example in U.S. Pat. No. 5,485,481.

Applicant observes that these techniques add cost and complexity to the amplifier while, especially in the case of metropolitan optical networks, it is important to reduce the cost of the system to a minimum.

U.S. Pat. No. 5,287,216 relates to an erbium-doped fiber optic amplifier in which the doped fiber is simultaneously pumped by multiple pump lasers generating optical waves of differing wavelengths. The optical waves are combined using a wavelength division multiplexer (WDM) before introduction into the doped fiber. The WDM used for the experimental measures can combine any pump between 960 and 975 nm with another in the 985 and 1000 nm range.

The Applicant observes that, due to the use of WDM for coupling the different wavelengths, the pump arrangement of U.S. Pat. No. 5,287,216 has relatively limited tolerance intervals for the pump wavelength, and requires to duplicate the number of pump sources if an active fiber has to be pumped bidirectionally or if two different active fibers have to be pumped.

The Applicant has faced the problem of providing an optical amplifier for an optical transmission system, in particular a fiber-optic amplifier suitable for metropolitan networks, that is stable with respect to temperature, cheap and simple, and that has an efficient and versatile pumping system. In particular, the Applicant has considered the problem of temperature-stabilizing an optical amplifier without carrying out a stabilization of the pump sources, which is usually an expensive operation.

The Applicant has found that an efficient way to temperature-stabilizing, in a predetermined temperature range, an optical amplifier comprising a set of active waveguides having a pump absorption coefficient showing a maximum at a predetermined wavelength, is to pump the set of active waveguides by a mixed pump radiation comprising at least a first and a second pump wavelength lower and, respectively, higher than said predetermined wavelength at an intermediate temperature of said temperature range. In this way, as the temperature varies, the amplifier's pump absorption coefficients at the different pump wavelengths vary with opposite signs, and the total gain of the amplifier remains substantially unchanged. The mixed pump radiation can be generated by mixing a plurality of pump beams by means of a set of optical couplers, which also split the mixed pump radiation into a plurality of power fractions used to pump at least one active waveguide bidirectionally, or at least two active waveguides monodirectionally.

This pumping scheme allows achieving a relatively high temperature-stability of the amplifier emission power, without requiring any technique for the temperature stabilization and/or the wavelength stabilization of the pump sources, and without the need of selecting a restricted subset of the manufactured pump laser diodes. Moreover, the proposed pumping arrangement is particularly versatile and reduces to a minimum the number of pump sources required to pump a predetermined number of active waveguides.

The technique of the present invention is advantageously applicable to erbium-doped fiber optical amplifiers, since for an erbium-doped fiber the relation between the pump absorption coefficient and the pump wavelength is represented by a substantially triangular curve (having a maximum at approximately 978 nm).

According to a first aspect, the present invention relates to an optical amplifier temperature-stabilized in a predetermined temperature range, comprising:

a set of active waveguides comprising at least one active waveguide, each waveguide of said set having a pump absorption coefficient showing a maximum at a predetermined wavelength;

a set of pump sources comprising at least two pump sources, for generating a plurality of pump beams at at least a first and a second pump wavelength, said first and second pump wavelength being lower and, respectively, higher than said predetermined wavelength at an intermediate temperature of said temperature range; and a set of optical couplers comprising at least one optical coupler, optically coupling the set of pump sources to the set of active waveguides, for feeding to the set of active waveguides a mixed pump radiation comprising a fraction of each of said pump beams; the at least one optical coupler having at least two outputs optically coupled to at least one active waveguide of said set of active waveguides for feeding to the at least one active waveguide a respective power fraction of the mixed pump radiation.

The at least one optical coupler is preferably a wavelength-independent optical coupler.

The set of active waveguides preferably comprises at least one active fiber.

The set of active waveguides preferably comprises at least one erbium-doped active waveguide.

The at least two outputs of the at least one optical coupler can be optically coupled to at least two different active waveguides of the set of active waveguides. Alternatively, the at least two outputs of the at least one optical coupler can be optically coupled to opposite ends of a same active waveguide of the set of active waveguides, for feeding the respective power fractions of the mixed pump radiation to said same active waveguide bidirectionally.

The set of optical couplers can comprise a first and a second subset of optical couplers, each optical coupler of the first subset having a plurality of inputs optically coupled to respective pump sources of the set of pump sources; and each optical coupler of the second subset having a plurality of inputs optically coupled to respective outputs of respective optical couplers of the first subset, and a plurality of outputs optically coupled to at least one active waveguide of the set of active waveguides.

The at least one optical coupler can be a 3 dB optical coupler.

The wavelength distance between the first and the second pump wavelength is preferably comprised between 10 and 30 nm, more preferably comprised between 10 and 20 nm.

According to a second aspect, the present invention relates to an optical telecommunication system, comprising an optical transmitter, an optical receiver, and a fiber optic line optically connecting the optical transmitter to the optical receiver and comprising a temperature-stabilized optical amplifier as previously defined.

According to a further aspect, the present invention relates to a method for temperature-stabilized amplification of optical signals in a predetermined temperature range, comprising:

generating a first and a second pump beams having a first and a second wavelength;

mixing the first and the second pump beams for obtaining a mixed pump radiation;

splitting the mixed pump radiation into two power fractions;

feeding each of the two power fractions to an active waveguide having a pump absorption coefficient showing a maximum at a predetermined wavelength; the first and the second wavelength being lower and, respectively, higher than the predetermined wavelength in the predetermined temperature range; and further feeding to the active waveguide the optical signals.

The step of feeding each of the two power fractions to an active waveguide can comprise feeding the two power fractions to two different active waveguides, or to a same active waveguide bidirectionally The active waveguide is preferably an optical fiber.

The active waveguide is preferably doped with erbium.

The wavelength distance between the first and the second pump wavelength is preferably comprised between 10 and 30 nm.

Advantageously, the first and the second pump wavelengths can have substantially the same wavelength distance from the predetermined wavelength at a temperature in the middle of the predetermined temperature range.

Further features and advantages of the present invention will appear more clearly from the following detailed description of some preferred embodiments, made with reference to the attached drawings. In such drawings:

FIG. 3 shows a first embodiment of an optical amplifier according to the present invention, including two pumps;

FIG. 4 shows a second embodiment of an optical amplifier according to the present invention, including two pumps;

Figure 1:
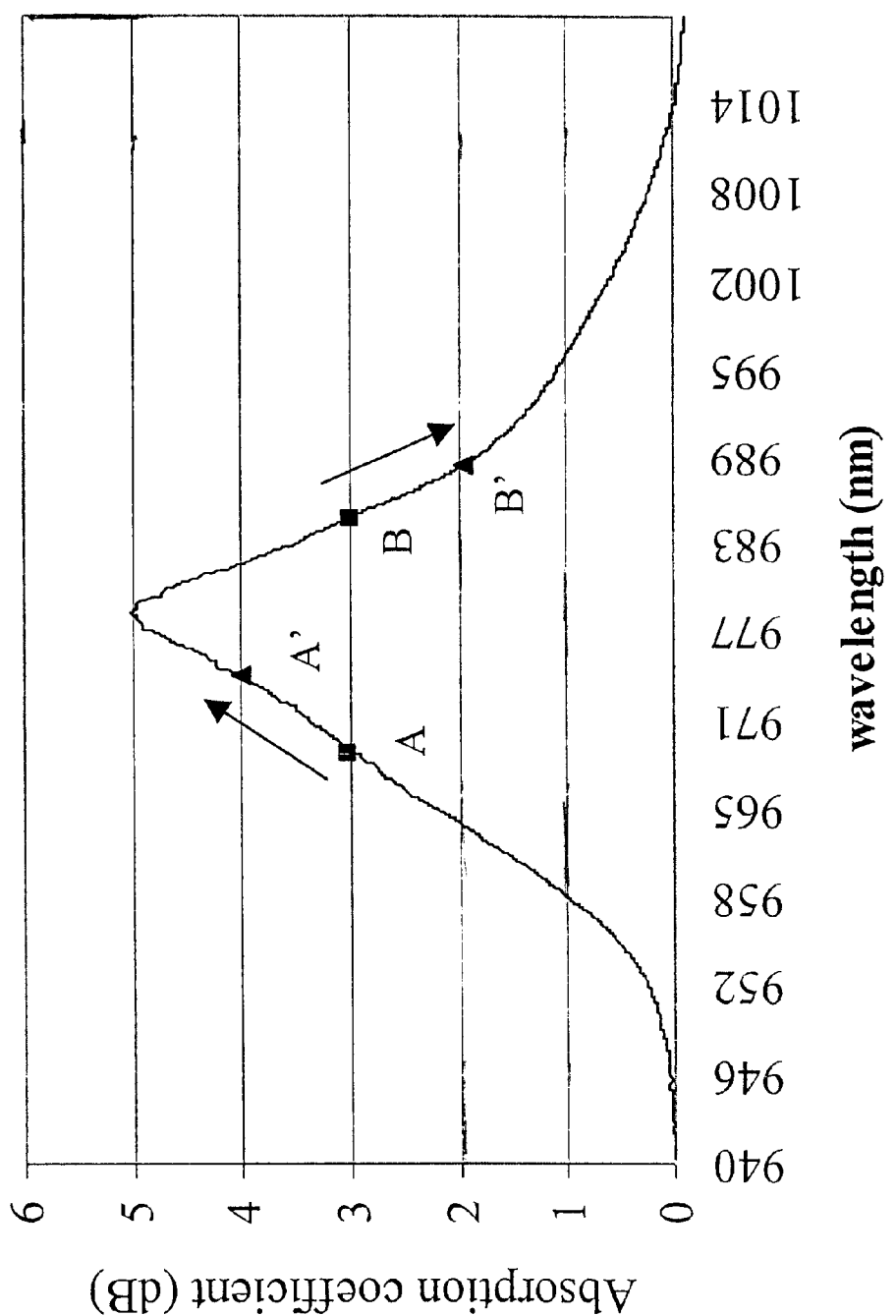
FIG. 1 shows the typical curve of absorption coefficient vs. emission wavelength for an erbium-doped active fiber.
Figure 2:
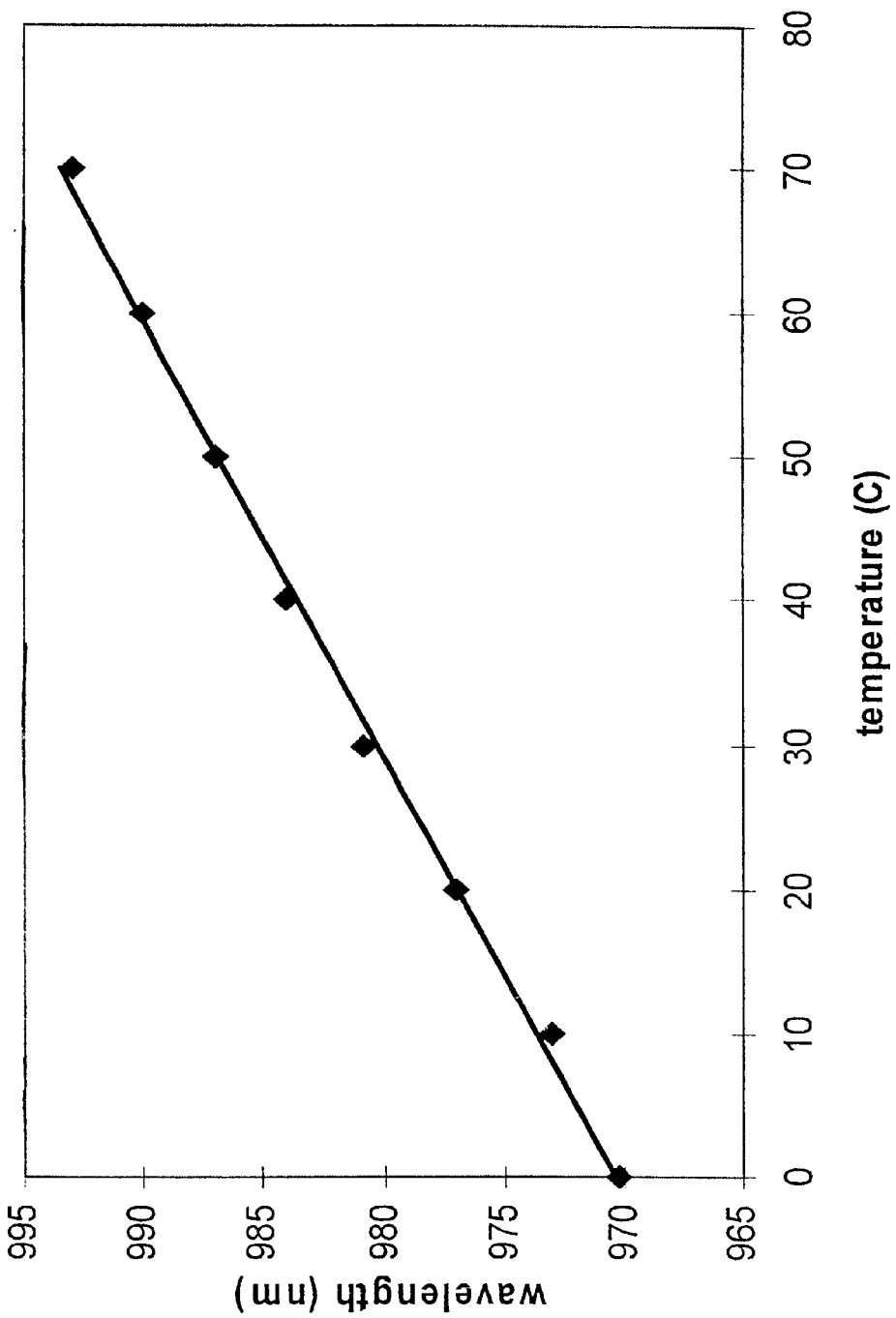
FIG. 2 illustrates a typical linear dependency of the emission wavelength on temperature for an erbium-doped active fiber.

An optical amplifier 100 according to the present invention is shown in FIG. 3. Amplifier 100 is adapted to amplify signals transmitted in a first and a second optical fiber 111, 112, having the same or opposite transmission directions. For example, the first and the second optical fibers 111, 112 may be the transmission fibers of a bi-directional transmission system.

Amplifier 100 includes a first and a second erbium-doped active fiber 101, 102, serially connected to the first and, respectively, the second optical fiber 111, 112 for the amplification of optical signals transmitted therein.

Amplifier 100 further includes a first and a second pump laser 103, 104 for generating a first pump beam at a first wavelength $\lambda_1$ and, respectively, a second pump beam at a second wavelength $\lambda_2$, both suitable to excite the erbium ions. Pump lasers 103, 104 are laser diodes, for example model LDM0980 manufactured by Pirelli.

As previously stated, the emission wavelengths $\lambda_1$ and $\lambda_2$ are function of the temperature of the pump laser 103, 104. Typically, the correct functioning of laser diodes should be guaranteed in the range of temperature between 0° C. and 65° C. According to the present invention, at temperatures in the middle of this range, the wavelengths $\lambda_1$ and $\lambda_2$ must be lower and, respectively, higher than the wavelength $\lambda_p$ corresponding to the peak of the curve of the pump absorption coefficient vs. emission wavelength of the active fiber, i.e. approximately 978 nm. Preferably, the wavelengths $\lambda_1$ and $\lambda_2$ have substantially the same wavelength distance from the wavelength $\lambda_p$ at a temperature of 32.5° C. (in the middle of the considered temperature range). This wavelength distance is preferably comprised between 5 and 15 nm, more preferably between 5 and 10 nm. Therefore, the wavelength distance between $\lambda_1$ and $\lambda_2$ is preferably comprised between 10 and 30 nm, more preferably between 10 and 20 nm.

A pump distribution device 105 optically couples the first and the second pump laser 103, 104 to the first and the second active fiber 101, 102. The pump distribution device 105 may comprise a 3 dB coupler, for generating a mixed pump radiation from the first and the second pump beam, and for providing part of the mixed pump radiation to the first active fiber 101 and part to the second active fiber 102. The mixed pump radiation comprises approximately half of the power of the first pump beam and half of the power of the second pump beam. More in details, the 3 dB coupler 105 has a first input coupled to the first pump laser 103 for receiving the first pump beam; a second input coupled to the second pump laser 104 for receiving the second pump beam; a first output optically coupled to the first active fiber 101 via a first WDM coupler 106, for providing to the first active fiber 101 a first power fraction of the mixed pump radiation; and a second output optically coupled to the second active fiber 102 via a second WDM coupler 107, for providing to the second active fiber 102 a second power fraction of the mixed pump radiation. The 3 dB coupler 105 can be, for example, model SMFC7250ASB10 manufactured by E-TEK.

The first WDM coupler 106 has a first input coupled to the first transmission fiber 111, a second input coupled to the first output of the 3 dB coupler 105 and an output coupled to the first active fiber 101. The second WDM coupler 107 has a first input coupled to the second transmission fiber 112, a second input coupled to the second output of the 3 dB coupler 105 and an output coupled to the second active fiber 102. WDM couplers 106, 107 can be 980/1550 WDM couplers, for example model SWDM0915SPR manufactured by E-TEK.

Amplifier 100 operates as follows. The first and the second pump beam generated by the first and, respectively, the second pump laser 103, 104, are fed to the 3 dB coupler 105, which mixes them and generates the mixed pump radiation. The 3 dB coupler 105 also splits the mixed pump radiation into the first and the second power fraction. As previously described, the mixed pump radiation has half of its power at the first wavelength $\lambda_1$ and half at the second wavelength $\lambda_2$. The two fractions of the mixed pump radiation are fed to the first and the second active fiber 101, 102 via the first and, respectively, the second WDM coupler 106, 107, together with the transmission signals conveyed by the first and the second transmission fibers 111, 112. Hence, each active fibers 101, 102 is pumped at both the first and the second wavelength $\lambda_1$, $\lambda_2$, and is therefore stabilized in temperature. In fact, as the temperature varies, the pump powers absorbed by the active fiber from the first diode laser and from the second diode lasers vary substantially of the same quantity $\Delta P$ but in opposite directions, and the total absorbed pump power remain substantially constant.

For example, an increase $\Delta T$ in temperature would produce a shift of the first wavelength $\lambda_1$ towards $\lambda_p$ and a shift of the second wavelength $\lambda_2$ away from $\lambda_p$, with respective contributes $+\Delta P_p$ and $-\Delta P_p$ to the absorbed pump radiation, and respective contributes $+\Delta G$ and $-\Delta G$ to the gain of the amplifier. This trend is valid only until $\lambda_1$ and $\lambda_2$ are on opposite parts with respect to $\lambda_p$, i.e. only within a limited range of temperature that depends on the wavelength distance of $\lambda_1$ and $\lambda_2$ from $\lambda_p$.

The Applicant has verified that if the wavelength distance $\Delta \lambda$ between $\lambda_1$ and $\lambda_2$ is at least 21.5 nm and $\lambda_1$ and $\lambda_2$ are substantially symmetric with respect to $\lambda_p$ at 32.5° C., $\lambda_1$ and $\lambda_2$ will ever remain on opposite parts of $\lambda_p$ (or eventually one of them will coincide with $\lambda_p$) when the temperature varies between 0° C. and 65° C. In fact, by considering an emission wavelength drift of 0.33 nm/° C., a temperature variation of 65° C. corresponds to an emission wavelength shift of 21.5 nm. Therefore, at 0° C., $\lambda_2$ will coincide with $\lambda_p$ and, at 65° C., $\lambda_1$ will coincide with $\lambda_p$. For wavelength distances $\Delta \lambda$ lower than 21.5 nm, $\lambda_1$ and $\lambda_2$ will remain on opposite parts of $\lambda_p$ only in a temperature range smaller than 0–65° C. and, over this range, the contributes to the gain of the amplifier will have the same sign.

Nevertheless, due to the present tolerance in the manufacturing of the laser diodes emitting at 980 nm, the choice of two laser diodes having wavelength emissions of 21.5 nm implies make an accurate selection among the manufactured laser diodes, and this selection, as stated before for the single-pumped unstable amplifier, implies a cost. Accordingly, two laser diodes having wavelength emissions lower than 21.5 nm can advantageously be chosen so as to allow the selection of the laser diodes within a larger subset of the manufactured devices, still having a better temperature-stability than with a single-pumped amplifier that is not temperature-stabilized. For example, as will be demonstrated below, pumping with two pump lasers having wavelength emission distant 16.5 nm permits a better temperature-stability than pumping with a single pump laser having the wavelength emission coincident with $\lambda_p$.

As a generalization of the amplifying architecture of FIG. 3, a number of pump laser diodes and active fibers equal to $2^n$, with $n \geq 1$, can be used.

FIG. 4 shows an amplifier 150 according to the present invention, differing from amplifier 100 in that the outputs of the first and the second WDM coupler 106, 107 are optically coupled to opposite ends of optical fiber 101, which is therefore bidirectionally pumped by the mixed pump radiation. More generally, the number of pump laser diodes can be twice the number of active fibers for bidirectionally pumping each active fiber.

Figure 5:
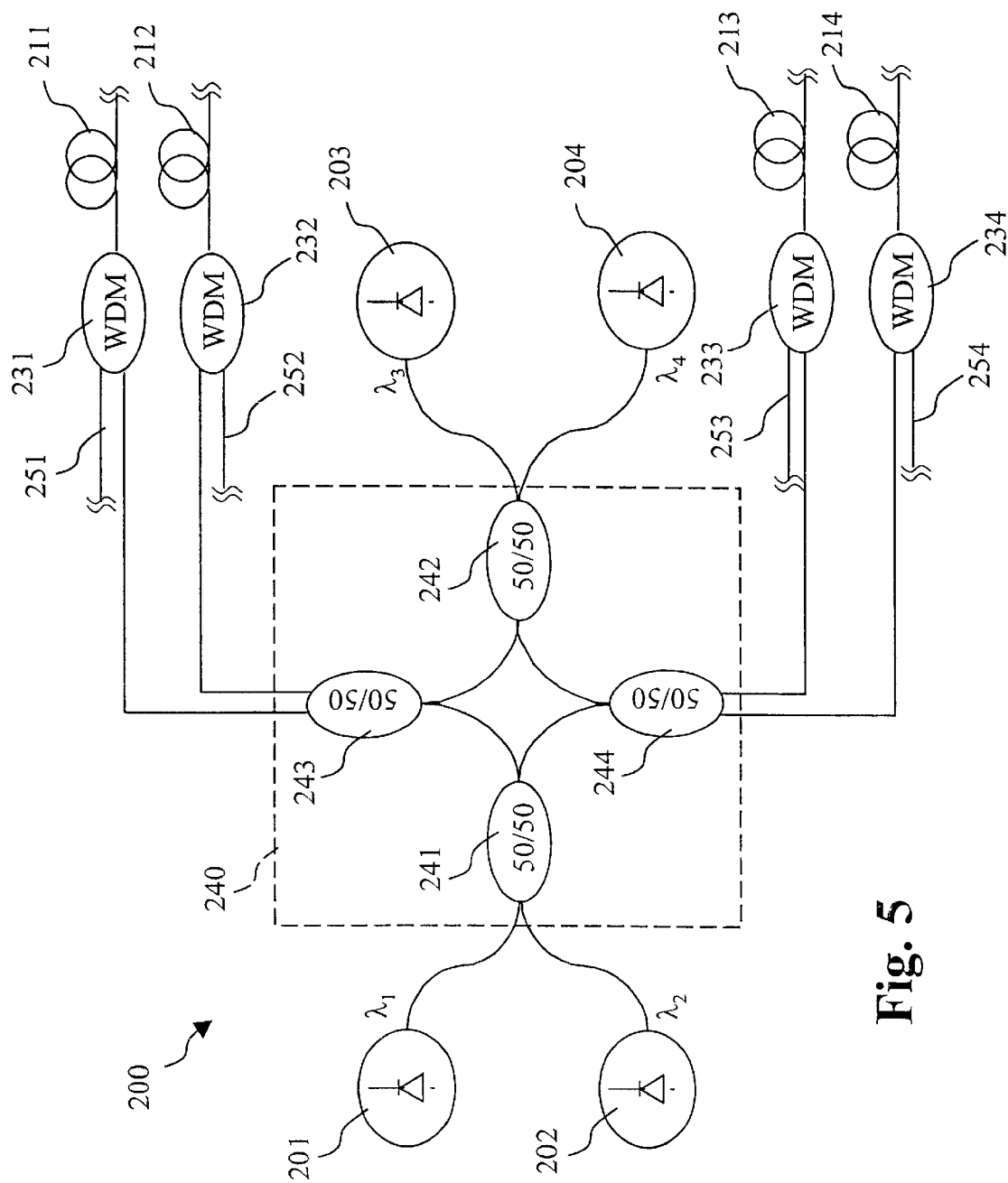
FIG. 5 shows a third embodiment of an optical amplifier according to the present invention, including four pumps.

FIG. 5 shows a further embodiment for the amplifier of the present invention, indicated with 200. Amplifier 200 includes four laser diodes 201–204, four active fibers 211–214, four WDM couplers 231–234 each coupling a respective active fiber 211–214 to a respective transmission fiber 251–254, and a pump distribution device 240 for coupling the laser diodes 201–204 to the active fibers 211–214 via the WDM couplers 231–234. The pump distribution device 240 comprises a first, a second, a third and a fourth 3 dB coupler 241–244 for coupling the laser diodes 201–204 to the WDM couplers 231–234.

Each of the first and the second 3 dB coupler 241, 242 has two inputs coupled to two respective laser diodes of the four laser diodes 201–204 for receiving the corresponding pump beams, and two outputs coupled to respective inputs of the third and the fourth 3 dB couplers 243, 244, to provide each of them with 50% of the power of the received pump beams. Therefore, both the third and the fourth 3 dB coupler 243, 244 will receive half of the power of each pump beam. Each of the third and the fourth 3 dB coupler 243, 244 has two outputs coupled to two respective WDM couplers of the four WDM couplers 231–234, for providing each WDM coupler (and then each active fiber 211–214) with a mixed pump radiation including approximately 25% of the power of each pump beam.

Amplifier 200 operates as follows. Laser diodes 201, 204 generate four different pump beams at respective wavelengths. The four pump beams are mixed in pairs by the first and the second 3 dB coupler 231, 232, and each mixed pair is split in two fractions, one of which is fed to the third 3 dB coupler 233 and the other to the fourth 3 dB coupler 234. Therefore, each of 3 dB couplers 233, 234 receives a beam including light at two different wavelengths ($\lambda_1$ and $\lambda_2$) at one of its inputs and a second mixed radiation including light at other two different wavelengths ($\lambda_3$ and $\lambda_4$ at the other input. In turn, each of the 3 dB couplers 233, 234 mixes power from the four pump beams and provides two power fraction of the mixed pump radiation at its outputs. Each power fraction, including four power contributions of substantially the same value at the four pump wavelengths $\lambda_1$-$\lambda_4$, is fed to a respective WDM coupler 231–234. Finally, the mixed pump radiation is fed to the active fibers 211–214 by the WDM couplers 231–233, with a little power loss.

The amplifier of the present invention can be advantageously used for the amplification of optical signals in a metro optical network.

Figure 9:
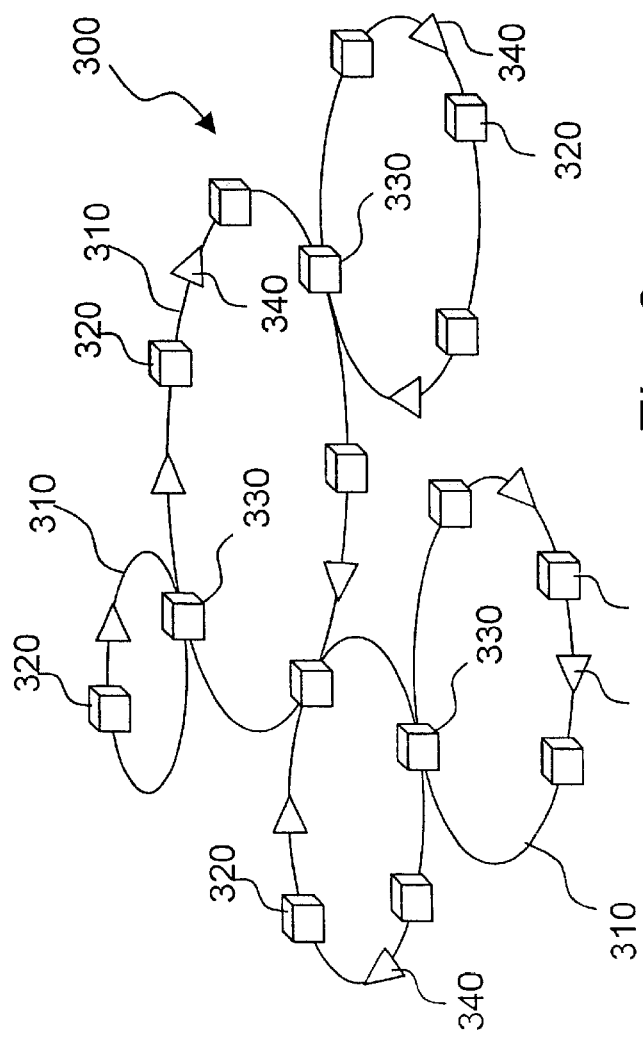
FIG. 9 illustrates an optical metropolitan network including optical amplifiers according to the present invention.

FIG. 9 shows a metropolitan optical network 300 comprising a plurality of interconnected rings 310. Rings 310 can have different lengths: 100–300 km in the case of Regional/Interoffice Networks (typically linking the interoffice facilities of local exchange carriers and the points-of-presence of inter-exchange carriers), 20–100 km in the case of Access Networks (distributing traffic from a Regional/Interoffice Network to end-users such as Internet service providers and competitive local-exchange carriers), and 5–20 km in the case of Enterprise Networks (linking different sites within organizations such as large corporations, financial institutions and universities). Each ring 310 comprises a plurality of line nodes 320 performing the insertion and the extraction of information to/from the network 300 by means of WADMs (Wavelength Add/Drop Multiplexers). Interconnecting nodes 330 connect together different rings and allow the exchange of information between rings. The metropolitan optical network 300 can also include optical amplifiers for the amplification of the optical signals, in particular DWDM (Dense Wavelength Division Multiplexing) ring/line amplifiers, WADM (Wavelength Add/Drop Multiplexers) pre/post amplifiers, WADM band add/drop amplifiers, and Single-Channel Amplifiers.

DWDM ring/line amplifiers are typically used in Regional/Interoffice Networks, and occasionally used in Access Networks, to boost signals because of fiber span loss. A DWDM ring/line amplifier can normally handle 16 to 32 channels. As shown in FIG. 9, each ring 310 can include one or more DWDM ring/line amplifiers 340.

Figure 10A:
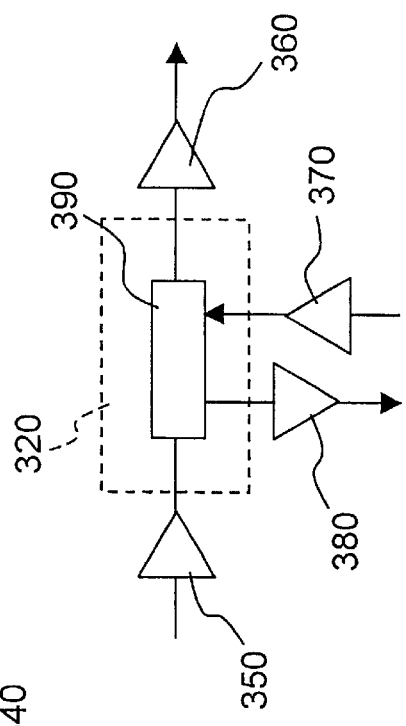
FIGS. 10a and 10b show different possible applications of an optical amplifier in the optical metropolitan network of FIG. 9.

WADM pre/post amplifiers are located before and/or after the line nodes and the interconnecting nodes to compensate loss associated with WADMs. FIG. 10a shows a WADM pre-amplifier 350 and a WADM post amplifiers 360 located before and after a line node 320.

The WADM band add/drop amplifiers are mainly used in Regional/Interoffice Networks and Access Networks where the majority of channels pass through a node where no amplification occurs, and a specific set of channels referred to as a "band" is added or dropped by a WADM. The WADM band add/drop amplifier boosts only the band that is added or dropped. For dropped channels the WADM functions as a band pre-amplifier prior to demultiplexing and successive reception of the channels. For added channels, the WADM functions as band post-amplifier after transmission and multiplexing of the channels. Typically, WADM band add/drop amplifiers handle up to four channels. FIG. 10a shows a WADM band add amplifier 370 and a WADM band drop amplifier 380 positioned on the add and drop lines of a WADM 390.

Figure 10B:
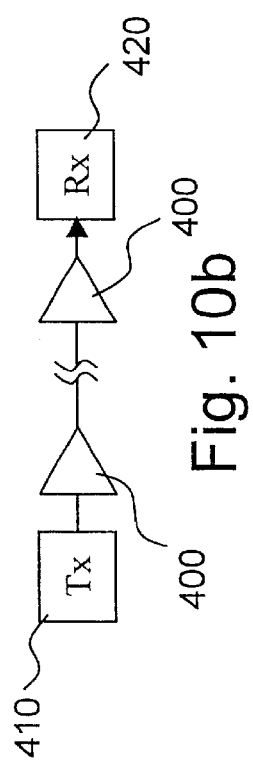

Single-Channel Amplifiers are used in some low-channel-count applications, in particular in Access Networks, for amplifying individual wavelengths at the transmitter or receiver. FIG. 10b shows two Single-Channel Amplifiers 400 located after a transmitter 410 and before a receiver 420.

Each of the optical amplifiers comprised in the optical network 300 can be an optical amplifier according to the present invention. In particular, according to the present invention, it is possible to realize an optical telecommunication system comprising at least an optical transmitter for generating optical signals, at least an optical receiver for receiving the optical signals, and at least an optical link connecting the optical transmitter to the optical receiver for conveying the optical signals from the optical transmitter to the optical receiver, wherein the optical link comprises at last a temperature-stabilized optical amplifier as claimed in claim 1. The optical link can comprise an optical fiber connection and optical devices used between the optical transmitter and the optical receiver. The optical link can be monodirectional or bidirectional. For example, the rings 310 can be either monodirectional or bidirectional.

MEASURES AND EXPERIMENTS

Figure 6:
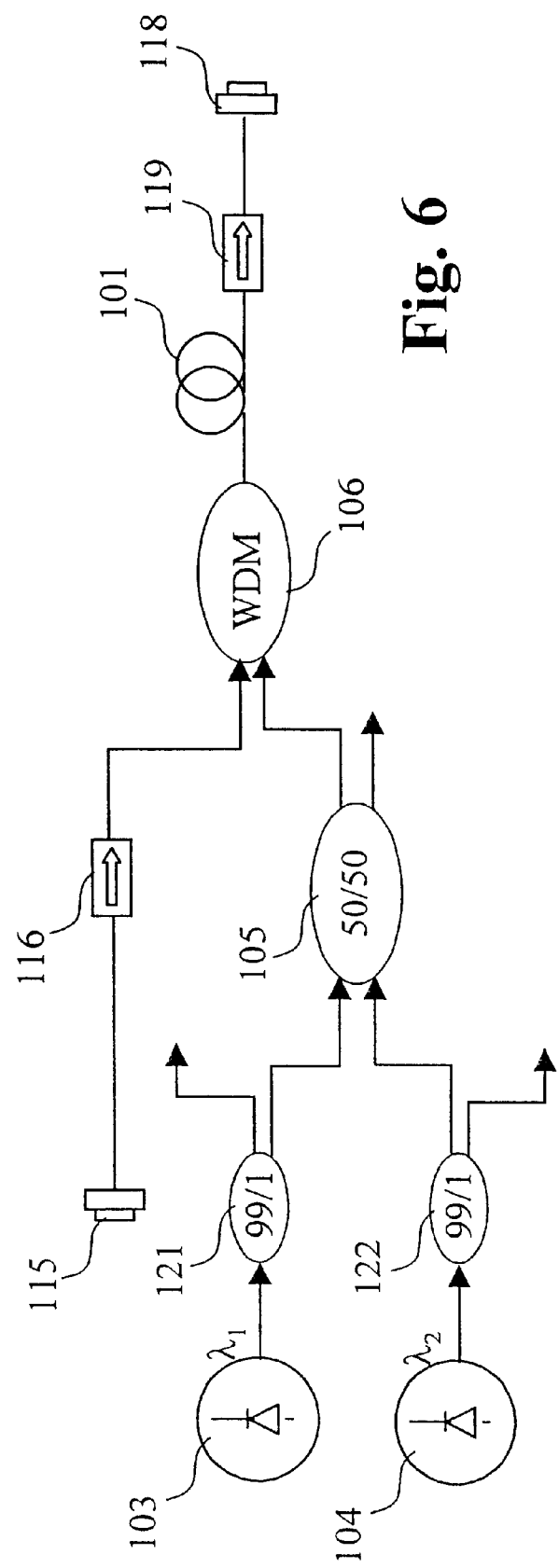
FIG. 6 illustrates an experimental setup for testing a two-pumps amplifier according to the present invention.

FIG. 6 shows an experimental setup used by the Applicant for performing experimental measures on the amplifier of the present invention.

The experimental setup of FIG. 6 differs from the pumping scheme of FIG. 3 in that the second WDM coupler 107 and the second active fiber 103 have been removed, and the second output of the 3 dB 105 is now optically coupled to a photodetector (not shown) for power metering purposes. An electrical feed-back is present between this photodetector and the laser diodes 103, 104. In practice, the tests on thermal-stability have been performed on only one active fiber, the results being extendable to the case of two active fibers.

The WDM coupler 106 has one input coupled to the first output of the 3 dB coupler 105 for receiving the mixed pump radiation, and the other input optically coupled to a laser source 115 for receiving both a saturating signal suitable to saturate the active fiber 101 and a probe signal of variable wavelength.

An optical isolator 116 is interposed between the laser source 115 and the WDM coupler 106 for avoiding reflected or scattered radiation to be transmitted backward to the laser source 115. The output of the WDM coupler 106 is coupled to the input of the active fiber 101.

The experimental setup further includes a photodetector 118 optically coupled to the output of the active fiber 101 to receive the amplified signal. A further optical isolator 119 is interposed between the active fiber 101 and the photodetector 118 for avoiding reflected or scattered radiation to be transmitted backward to the active fiber 103.

A pair of 99.5/0.5 couplers 121, 122 (depicted as 99/1 for simplicity) each coupled to the output of a respective laser diode 103, 104, allow the extraction of 0.5% of the pump radiation for power monitoring purposes.

The active fiber 101 is a single-mode erbium-doped fiber having a length of 12 m, a numeric aperture NA of 0.24, a cut-off wavelength of 940 nm, an absorption at the peak wavelength of 5 dB/m, and an Aluminum (Al) molar concentration of about 10%.

WDM coupler 106 is a 980/1550 coupler, model SWDM0915SPR produced by E-TEK. Laser source 115 is model TUNICS-PR produced by PHOTONETICS.

Laser diodes 103, 104 are model LDM0980 produced by PIRELLI. In order to test several different couples of pump wavelengths, laser diodes 103, 104 have been selected among a set of three laser diodes having different wavelength emission due to manufacturing tolerance, in particular having wavelength emissions of 971.5 nm, 977 nm and 987 nm at 25° C.

The different operative wavelengths required for performing the tests have been obtained by controlling the temperature of the above laser diodes For example, to simulate the operation of a laser diode emitting at 974 nm at 25° C., the Applicant has used the laser diode having wavelength emissions of 977 nm at 25° C., by operating it at 16°.

All the experiments have been performed with an emission power of 40 mW from each laser diode 103, 104, a saturating signal of −10 dBm at 1550 nm and a −30 dBm probe signal with wavelength variable between 1528 nm and 1560 nm.

The gain of the amplifier has been then calculated as the ratio between the output power and the input power. Also, the ASE power has been measured, to derive the noise generated by the amplifier and, therefore, its noise figure (NF).

The measure has been repeated several times, each time by setting a different temperature between 0° C. and 70° C. for the laser diodes 103, 104, so as to simulate all the possible environmental conditions that the amplifier should tolerate.

During the measures, a feed-back from the 0.5% outputs of the 99.5/0.5 couplers 121, 122 and from the 3 dB coupler 105 towards the laser diodes 103, 104 has been used to maintain the pump power constant.

A first set of measures has been performed by using only one laser diode, i.e. by using pump radiation at a single wavelength. FIG. 7a shows the dependence of amplifier gain from temperature, when the temperature is varied from 0° C. to 65° C., using a pump wavelength of 974 nm at 25° C. The gain values have been measured for a signal wavelength of 1552 nm, approximately in the center of the considered wavelength band. As can be observed in FIG. 7a, the difference between the peak and the minimum of the curve (i.e. the maximum gain variation) is approximately 2 dB.

Figure 7B:
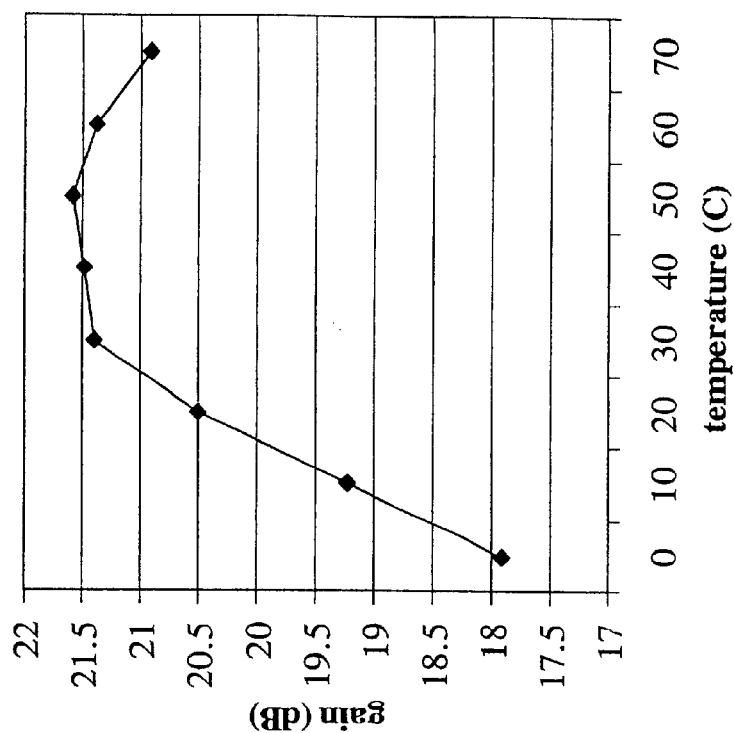
FIGS. 7a–7f show the results of experimental tests.
Figure 7A:
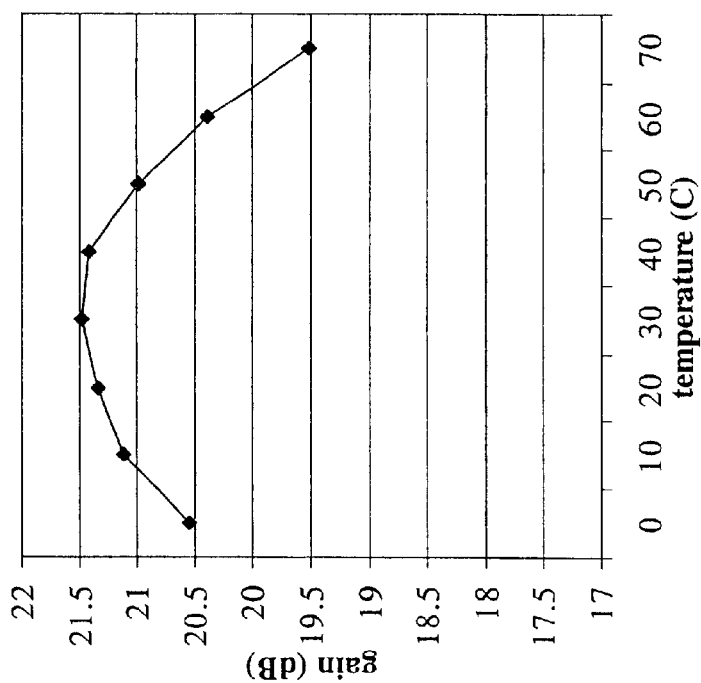
Figure 7D:
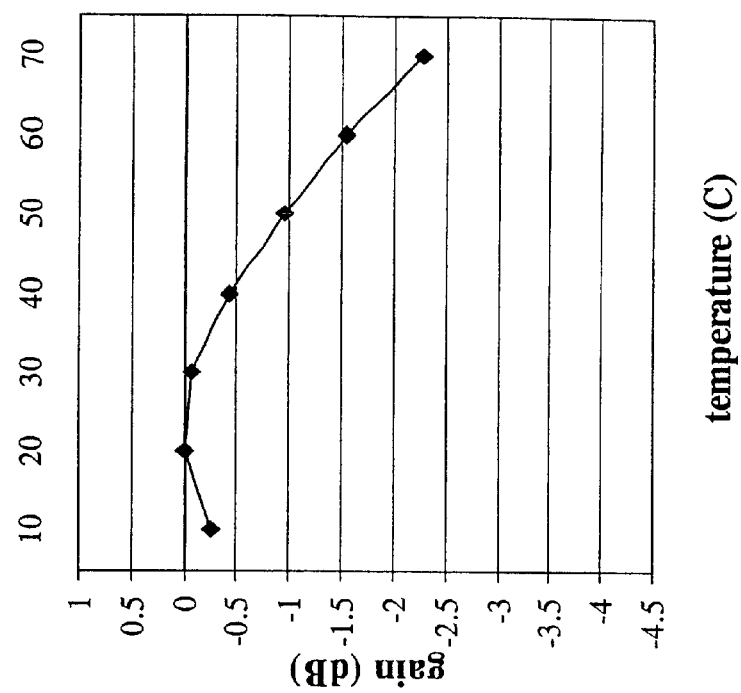
Figure 7C:
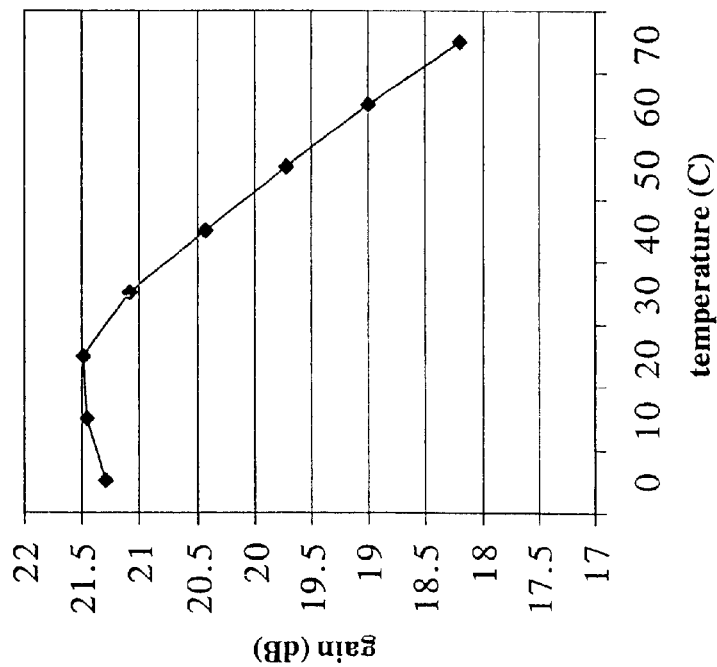

Other measures, whose results are shown in FIG. 7b and 7c, have been performed with a single pump wavelength at 969 nm and 979 nm (at 25° C.). In these cases it has been found that the maximum variation of the amplifier gain increases up to more than 3.5 dB.

Therefore, the pump absorption variation with temperature can be reduced by choosing, among the manufactured 980 nm pump lasers, those having at 32.5° C. (i.e. in the middle of the considered temperature range) an emission wavelength coinciding with the wavelength of the peak of the curve of absorption coefficient vs. emission wavelength (i.e. approximately 978 nm). For those particular diodes, the working point moves almost symmetrically along the said curve in the considered temperature range, and the variation of the pump absorption can be as low as 2 dB. Nevertheless, the particular choice of the pump laser is to be considered as a cost, since only a few of the manufactured pump lasers have such an emission wavelength.

During the measures with a single pump wavelength, the Applicant has also analyzed the dependence of the gain of the amplifier on the transmission wavelength, and has verified that the flatness of the gain curve increases by increasing the pump emission wavelength from 969 nm to 979 nm.

Further measures have been performed by using the double pump scheme of FIG. 6.

FIG. 7d shows the results of measures performed by using two pump wavelengths distant 10.5 nm, precisely $\lambda_1$=971.5 nm and $\lambda_2$=982 nm at 25° C. These wavelengths have been selected so as to have substantially the same wavelength distance ($\Delta\lambda/2$) from $\lambda_p$ at 32.5° C. The resulting mixed pumping radiation will then be referred to as "centered" with respect to the cross-absorption vs. wavelength curve.

Figure 7F:
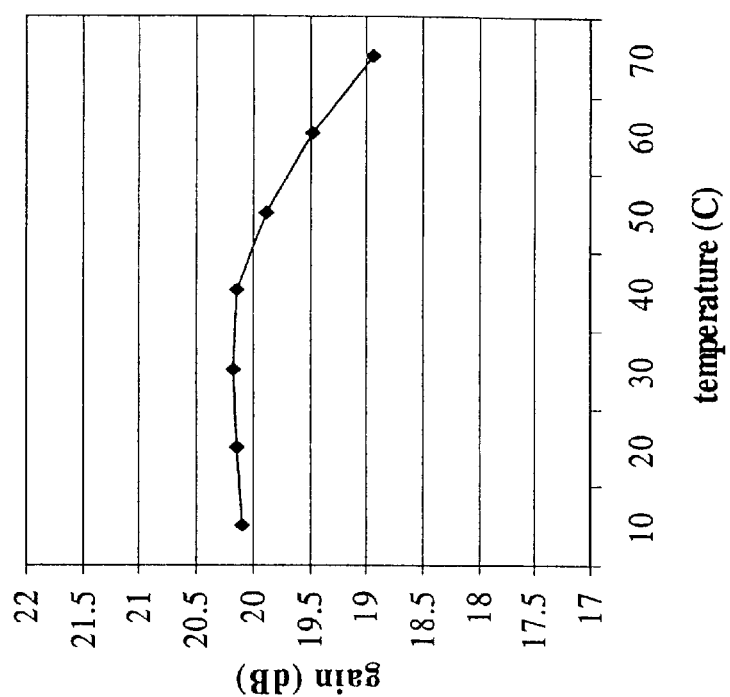
Figure 7E:
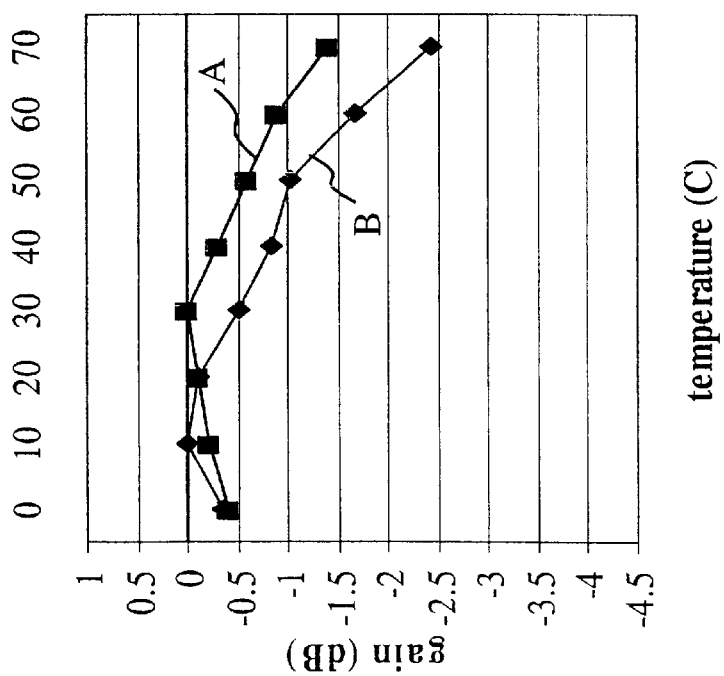

FIG. 7e shows the result of two sets of measures performed by using two pump wavelengths distant 16.5 nm, in particular a first set of measures in which $\lambda_1$=970.5 nm and $\lambda_2$=987 nm at 25° C. (curve A), and a second set of measures in which $\lambda_1$=965.5 nm and $\lambda_2$=982 nm at 25° C. (curve B). In the first case, the wavelengths have been selected with substantially the same wavelength distance ($\Delta\lambda/2$) from 976 nm at 32.5° C. Differently from the previous case, the Applicant has considered a wavelength equal to 976 nm instead of $\lambda_p$ for "centering" the mixed pumping radiation, so as to take into account the asymmetry of the cross-absorption vs. wavelength curve. Therefore, the mixed pump radiation resulting from $\lambda_1$=970.5 nm and $\lambda_2$=987 nm at 25° C. will still referred to as "centered", although in this case the reference wavelength is 976 nm, and the mixed pump radiation resulting from $\lambda_1$=965.5 nm and $\lambda_2$=982 nm is "shifted" of −5 nm with respect to the "centered" pump radiation, and it will be referred to as a "shifted" pump radiation.

FIG. 7f shows the result of measures performed by using two pump wavelengths distant 21.5 nm, precisely $\lambda_1$=965.5 nm and $\lambda_2$=987 nm. Again, the wavelengths have been selected with substantially the same wavelength distance ($\Delta\lambda/2$) from $\lambda_p$ at 32.5° C., and the resulting mixed pumping radiation will be referred to as "centered" with respect to the cross-absorption vs. wavelength curve.

In FIGS. 7d and 7e, the gain curves have been normalized to the respective peak values. The gain values have been measured for a signal wavelength of 1552 nm.

It can be noticed that, when the wavelength distance $\Delta\lambda$ between the pump wavelengths increases, the gain shifts due to temperature variation decrease. In particular, the maximum gain variation is approximately 2.3 dB for the "centered" mixed pump radiation having $\Delta\lambda$=10.5 nm, 2.4 dB for the "centered" mixed pump radiation having $\Delta\lambda$=16.5 nm, 1.4 dB for the "shifted" mixed pump radiation having $\Delta\lambda$=16.5 nm, and 1.3 dB for the "centered" mixed pump radiation having $\Delta\lambda$=21.5 nm. This trend has been verified for wavelength distances $\Delta\lambda$ up to 21.5 nm. For pump wavelength distances $\Delta\lambda$ greater than 21.5 nm, the gain shift due to temperature variations is expected to increase again, due to the mechanism previously described. Therefore, a pump wavelength distance $\Delta\lambda$=21.5 nm allows to minimize the gain shift due to temperature variations.

The Applicant has verified that the curve of the gain of the amplifier vs. transmission wavelength is more flat in the case of a double diode pump scheme than in a single diode pump scheme.

Figure 8:
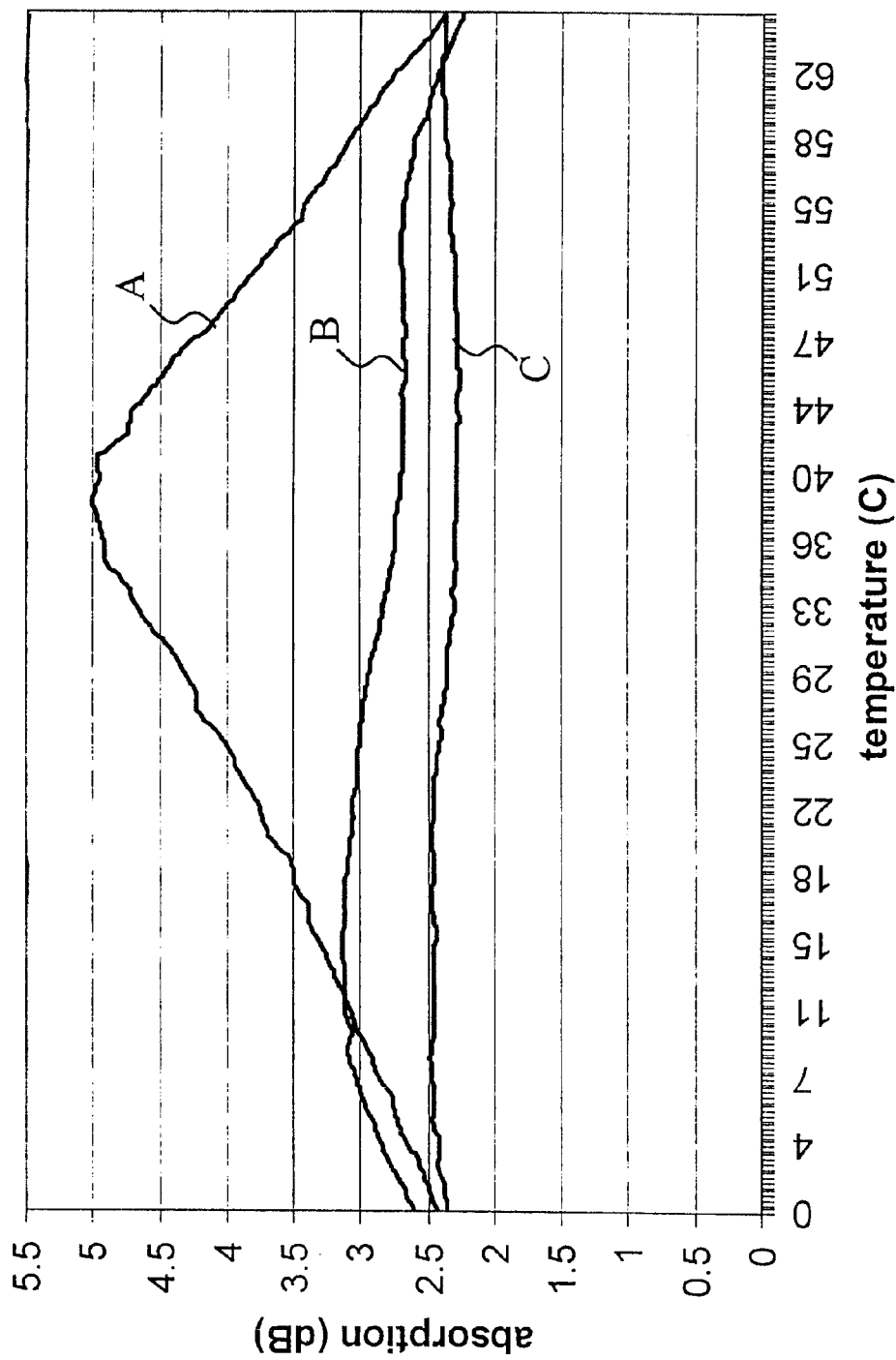
FIG. 8 show the result of a numeric simulation.

The Applicant has also determined the pump absorbed by the active fiber by means of a numeric simulation of the system of FIG. 6. FIG. 8 shows the result of the numeric simulation in the case of the single pump wavelength $\lambda$=976 nm at 25° C. (curve A), of the "centered" mixed pump radiation having $\Delta\lambda$=16.5 nm (curve B), and of the "centered" mixed pump radiation having $\Delta\lambda$=21.5 nm (curve C). As can be derived from FIG. 8, the minimum variations of pump absorption with temperature occurs in the case of the "centered" mixed pump radiation having $\Delta\lambda$=21.5 nm.

In the case of the "centered" mixed pump radiation having $\Delta\lambda$=16.5 nm (curve B), the pump absorption shows a decrease close to the extreme temperatures 0° C. and 65° C. This is due to the fact that $\lambda_2$ becomes lower than $\lambda_p$ when the temperature decreases below a first limit between 0° C. and 32.5° C., and $\lambda_1$ becomes higher than $\lambda_p$ when the temperature increases over a second limit between 32.5° C. and 65° C. When the temperature further decreases or increases over these limits, the pump powers absorbed by the active fiber from the first diode laser and from the second diode lasers decrease substantially of the same quantity $-\Delta P$, and the total pump power absorption variation is therefore $-2\cdot\Delta P$.

During the above described measures, the Applicant has also analyzed the dependence of the gain of the amplifier on the transmission wavelength, and has verified that the two-wavelength pumping scheme allows to achieve a greater flatness of the gain curve with respect to a single-wavelength pumping scheme, and that a higher flatness is expected for a higher number of appropriate pumping wavelengths.

Although the present invention has been described in terms of specific exemplary embodiments, it will be appreciated that various modifications and alterations might be made by those skilled in the art without departing from the spirit and scope of the invention as set forth in the following claims.

In general, the mixed pump radiation can be fed to each active fiber of the amplifier in a co-propagating direction, in a counter-propagating direction, or bidirectionally.

The mixed pump radiation can include any number of wavelengths mixed together. For example, three pump laser diodes can be used together by a 3×3 coupler, so as to have a three-wavelength mixed pump radiation. In this case, two wavelengths can be chosen lower than $\lambda_p$ and one greater than $\lambda_p$, or vice versa.

The different pump beams generating the mixed pump radiation can also have different powers. In this case, the wavelength and the powers of each pump beam will be chosen so as to balance the global effect due to temperature variation. Moreover, couplers having coupling ratio different from 50/50 can be used.

The pumping arrangement of the present invention can also be applied to integrated optics amplifiers as well.

What is claimed is:

1. An optical amplifier temperature-stabilized in a predetermined temperature range, comprising:

a set of active waveguides (101, 102; 211–214) comprising at least one active waveguide, each waveguide of said set having a pump absorption coefficient showing a maximum at a predetermined wavelength;

a set of pump sources (103, 104; 201–204) comprising at least two pump sources, for generating a plurality of pump beams at at least a first and a second pump wavelength ($\lambda_1$, $\lambda_2$), said first and second pump wavelength being lower and, respectively, higher than said predetermined wavelength at an intermediate temperature of said temperature range; and a set of optical couplers (105; 241–244) comprising at least one optical coupler, optically coupling the set of pump sources (103, 104; 201–204) to the set of active waveguides (101, 102; 211–214), for feeding to the set of active waveguides (101, 102; 211–214) a mixed pump radiation comprising a fraction of each of said pump beams; the at least one optical coupler (105) having a plurality of outputs optically coupled to at least one active waveguide of said set of active waveguides for feeding to the at least one active waveguide a respective power fraction of the mixed pump radiation.

2. An optical amplifier according to claim 1, characterized in that the at least one optical coupler is a wavelength-independent optical coupler.

3. An optical amplifier according to claim 1, characterized in that the set of active waveguides (101, 102; 211–214) comprises at least one active fiber.

4. An optical amplifier according to claim 1, characterized in that said set of active waveguides (101, 102; 211–214) comprises at least one erbium-doped active waveguide.

5. An optical amplifier according to claim 1, characterized in that the plurality of outputs of the at least one optical coupler are optically coupled to two different active waveguides (101, 102) of the set of active waveguides.

6. An optical amplifier according to claim 1, characterized in that the plurality of outputs of the at least one optical coupler are optically coupled to opposite ends of a same active waveguide (101) of the set of active waveguides, for feeding the respective power fractions of the mixed pump radiation to said same active waveguide (101) bidirectionally.

7. An optical amplifier according to claim 1, characterized in that the set of optical couplers (241–244) comprises a first (241, 242) and a second (243, 244) subset of optical couplers, each optical coupler of the first subset (241, 242) having a plurality of inputs optically coupled to respective pump sources of the set of pump sources (201–204); and each optical coupler of the second subset (243, 244) having a plurality of inputs optically coupled to respective outputs of respective optical couplers of the first subset (241, 242), and a plurality of outputs optically coupled to at least one active waveguide of the set of active waveguides (211–214).

8. An optical amplifier according to claim 1, characterized in that the at least one optical coupler is a 3 dB optical coupler.

9. An optical amplifier according to claim 1, characterized in that the wavelength distance between the first and the second pump wavelength ($\lambda_1, \lambda_2$) is comprised between 10 and 30 nm.

10. An optical amplifier according to claim 9, wherein the wavelength distance between the first and the second pump wavelength ($\lambda_1, \lambda_2$) is comprised between 10 and 20 nm.

11. An optical telecommunication system, comprising an optical transmitter (410) for generating optical signals, an optical receiver (420) for receiving the optical signals, and an optical fiber link optically connecting the optical transmitter to the optical receiver and comprising a temperature-stabilized optical amplifier (400) as claimed in claim 1.

12. A method for temperature-stabilized amplification of optical signals in a predetermined temperature range, characterized in that it comprises generating a first and a second pump beam having a first and a second wavelength;

mixing the first and the second pump beam for obtaining a mixed pump radiation;

splitting the mixed pump radiation into two power fractions;

feeding each of the two power fractions to an active waveguide having a pump absorption coefficient showing a maximum at a predetermined wavelength; the first and the second wavelength being lower and, respectively, higher than the predetermined wavelength in the predetermined temperature range; and further feeding to the active waveguide the optical signals.

13. A method according to claim 12, characterized in that the step of feeding each of the two power fractions to an active waveguide comprises feeding the two power fractions to two different active waveguides.

14. A method according to claim 12, characterized in that the step of feeding each of the two power fractions to an active waveguide comprises feeding the two power fractions to a same active waveguide bidirectionally.

15. A method according to claim 12, characterized in that the active waveguide is an optical fiber.

16. A method according to claim 12, characterized in that the active waveguide is doped with erbium.

17. A method according to claim 12, wherein the wavelength distance between the first and the second pump wavelength is comprised between 10 and 30 nm.

18. A method according to claim 12, wherein the first and the second pump wavelengths have substantially the same wavelength distance from the predetermined wavelength at a temperature in the middle of the predetermined temperature range.

* * * * *